United States Patent
Oh et al.

(10) Patent No.: US 11,233,352 B2
(45) Date of Patent: Jan. 25, 2022

(54) ELECTRO-CONDUCTIVE PART PROTECTING MEMBER FOR SIGNAL TRANSMISSION CONNECTOR

(71) Applicant: TSE CO., LTD., Chungcheongnam-do (KR)

(72) Inventors: Chang Su Oh, Chungcheongnam-do (KR); Bo Hyun Kim, Chungcheongnam-do (KR); Sung Ho Yoon, Chungcheongnam-do (KR)

(73) Assignee: TSE CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/289,343

(22) PCT Filed: Jan. 3, 2020

(86) PCT No.: PCT/KR2020/000099
§ 371 (c)(1),
(2) Date: Apr. 28, 2021

(87) PCT Pub. No.: WO2020/145577
PCT Pub. Date: Jul. 16, 2020

(65) Prior Publication Data
US 2021/0313730 A1    Oct. 7, 2021

(30) Foreign Application Priority Data
Jan. 8, 2019 (KR) .......................... 10-2019-0002320

(51) Int. Cl.
*H05K 1/11* (2006.01)
*H01R 13/447* (2006.01)
(Continued)

(52) U.S. Cl.
CPC ....... *H01R 13/447* (2013.01); *G01R 1/06733* (2013.01); *G01R 31/2886* (2013.01); *G01R 1/06716* (2013.01); *H01R 2201/20* (2013.01)

(58) Field of Classification Search
CPC .. H01R 13/447; H01R 13/24; H01R 13/2414; G01R 1/00733; G01R 31/2866
See application file for complete search history.

(56) References Cited

U.S. PATENT DOCUMENTS 5,624,268 A * 4/1997 Maeda .................... H05K 3/325
                                                                          439/66
6,168,442 B1 * 1/2001 Naoi ................... H01R 13/2414
                                                                          439/66
(Continued)

FOREIGN PATENT DOCUMENTS

JP    2013-007730    1/2013
JP    2013-007750    1/2013
(Continued)

OTHER PUBLICATIONS

International Search Report dated Apr. 8, 2020 for PCT/KR2020/000099.
(Continued)

*Primary Examiner* — Neil Abrams

(57) ABSTRACT

The purpose of the present disclosure is to provide a electro-conductive part protecting member for a signal transmitting connector and a manufacturing method therefor, and a signal transmitting connector having same and a manufacturing method therefor, the electro-conductive part protecting member being capable of protecting an electro-conductive part so as to be able to minimize deformation of and damage to the electro-conductive part coming into contact with the terminals of an electronic component such as a semiconductor package, and more specifically, the electro-conductive part protecting members capable of (Continued)

being elastically modified in the longitudinal direction of the electro-conductive parts by having a hollow tube-shaped protection member body encompassing the electro-conductive parts, and a spiral groove to promote elasticity provided along the circumference of the protection member body so as to pass through the inside and the outside of the protection member body.

7 Claims, 13 Drawing Sheets

(51) Int. Cl.
 G01R 1/067 (2006.01)
 G01R 31/28 (2006.01)

(56) References Cited

U.S. PATENT DOCUMENTS

| | | | | |
|---|---|---|---|---|
| 7,156,669 | B2* | 1/2007 | Asai | H01L 21/486 439/91 |
| 7,220,287 | B1* | 5/2007 | Wyrzykowska | H01L 23/49822 29/25.03 |
| 7,402,515 | B2* | 7/2008 | Arana | H01L 21/76898 438/639 |
| 7,736,152 | B2* | 6/2010 | Hougham | H01R 43/007 439/66 |
| 9,231,328 | B2* | 1/2016 | Rathburn | H01R 13/2485 |
| 9,439,298 | B2* | 9/2016 | Ju | H01L 23/49883 |
| 9,488,675 | B2* | 11/2016 | Lee | H01R 43/002 |
| 9,759,742 | B2* | 9/2017 | Lee | G01R 1/0466 |
| 9,983,229 | B2* | 5/2018 | Han | H01R 24/20 |
| 2004/0029411 | A1* | 2/2004 | Rathburn | H01L 23/49827 439/66 |
| 2012/0062270 | A1* | 3/2012 | Rathburn | G01R 1/0491 324/762.05 |
| 2017/0110820 | A1* | 4/2017 | Chui | G01R 1/06722 |
| 2021/0313730 | A1* | 10/2021 | Oh | G01R 3/00 |

FOREIGN PATENT DOCUMENTS

| | | |
|---|---|---|
| JP | 2017-054773 | 3/2017 |
| KR | 10-2007-0099954 | 10/2007 |
| KR | 10-2009-0018699 | 2/2009 |
| KR | 10-1526536 | 6/2015 |
| KR | 10-1593936 | 2/2016 |
| KR | 10-2016-0046621 | 4/2016 |
| KR | 10-2018-0049424 | 5/2018 |
| KR | 10-1860923 | 5/2018 |
| KR | 10-1930866 | 12/2018 |
| WO | WO 2009-128619 | 10/2009 |

OTHER PUBLICATIONS

Korean Office Action dated Dec. 9, 2019 corresponding to Korean Patent Application No. 10-2019-0002320.
Korean Notice of Allowance dated Apr. 20, 2020 corresponding to Korean Patent Application No. 10-2019-0002320.

* cited by examiner

ELECTRO-CONDUCTIVE PART PROTECTING MEMBER FOR SIGNAL TRANSMISSION CONNECTOR

This application claims the priority of Korean Patent Application No. 10-2019-0002320, filed on Jan. 8, 2019 in the KIPO (Korean Intellectual Property Office), the disclosure of which is incorporated herein entirely by reference. Further, this application is the National Stage application of International Application No. PCT/KR2020/000099, filed on Jan. 3, 2020, which designates the United States and was published in Korean. Each of these applications is hereby incorporated by reference in their entirety into the present application.

TECHNICAL FIELD

The present disclosure relates to a signal transmitting connector, and more particularly, to an electro-conductive part protecting member for a signal transmitting connector, which may be provided in the signal transmitting connector, that is connected to an electronic component such as a semiconductor package and transmits an electrical signal, to protect an electro-conductive part, a method of manufacturing the same, a signal transmitting connector having the same, and a method of manufacturing the above signal transmitting connector.

BACKGROUND ART

In general, various types of connectors for transmitting an electrical signal are used in various fields such as an electronic industrial field or a semiconductor industrial field.

As one example, in the case of a semiconductor package, it is manufactured through a pre-process, a post-process, and a test process, and a connector is used in these manufacturing processes. The pre-process is also called a FAB process, and is a process for forming an integrated circuit on a wafer made of single crystal silicon material. The post-process is also called an assembly process, and is a process for forming a semiconductor package by dividing the wafer into respective chips, connecting an electro-conductive lead or ball to the chip to enable electrical signal connection to be formed between the chip and an external device, and molding the chip with resin such as epoxy resin for protecting the chip from an external environment. The test process is a process of testing whether a semiconductor package is operating normally to select a good product and a defective product.

One of the core components applied to the test process is a connector called a test socket. The test socket is mounted on a printed circuit board electrically connected to a tester for testing an integrated circuit, and is used for inspection of a semiconductor package. The test socket has a contact pin, and this contact pin electrically connects a lead of the semiconductor package and a terminal of a printed circuit board.

The tester generates an electrical signal for testing the semiconductor package to be connected to the test socket, outputs it to the semiconductor package, and then tests whether the semiconductor package is operated normally by using the electrical signal input through the test socket. As a result, the semiconductor package is determined as a good product or a defective product.

On the other hand, recently, a price of tester is being increased due to the increase of a device under test (DUT) for high-speed, high-functionality, and productivity improvement of an integrated circuit. In order to efficiently utilize this expensive tester, it is very important to select and use an appropriate test socket and to manage the lifetime of the test socket.

If performance of the test socket is degraded due to the end of the life of the test socket during inspection of a large amount of semiconductor packages, a problem that a high-quality semiconductor package is treated as a defective product occurs. In addition, since the expensive tester and handler should be stopped for replacement whenever a defective test socket occurs, the efficiency of the test is degraded, and as a result, the production yield is adversely affected.

FIG. 1 is a view showing a conventional test socket used for inspecting a semiconductor package.

When a semiconductor package is inspected, a terminal 12 of a semiconductor package 10 comes into contact with an electro-conductive part 22 of a test socket 20. At this time, the test socket 20 is subjected to pressure, and the electro-conductive part 22 is impacted and spread outward, and if this phenomenon is repeated, problems that the electro-conductive part 22 is damaged and a lifetime of the test socket 20 is shortened occurs.

To solve these problems, research and development for developing a signal transmitting connector, which can prevent deformation of the electro-conductive part and reduce damage to the electro-conductive part when the terminal of an electronic component such as a semiconductor package is pressed against the electro-conductive part, has been continuously conducted.

DISCLOSURE OF THE INVENTION

Technical Problem

The present disclosure is conceived in consideration of the above-described problems, an object of the present disclosure is to provide an electro-conductive part protecting member for a signal transmitting connector that can protect an electro-conductive part so as to minimize deformation of and damage to the electro-conductive part brought into contact with a terminal of an electronic component such as a semiconductor package, and a method of manufacturing the same, a signal transmitting connector having the same, and a method of manufacturing the signal transmitting connector.

Technical Solution

In order to solve the above-described object, an electro-conductive part protecting member for a signal transmitting connector according to the present disclosure is an electro-conductive part protecting member for a signal transmitting connector, which is provided in the signal transmitting connector having a plurality of electro-conductive parts and an insulating part and is capable of protecting the electro-conductive part, the electro-conductive part having a configuration in which a plurality of electro-conductive particles are contained in an elastic insulating material in order to enable the electro-conductive part to be connected to a terminal of an electronic component, and the insulating part being formed of an elastic insulating material and supporting the plurality of electro-conductive parts so as to allow the electro-conductive parts to be spaced apart from each other, wherein the electro-conductive part protecting member comprises a hollow tubular-shaped protection member body disposed in the insulating part so as to be spaced apart from and surround the electro-conductive part, and a spiral groove formed in a spiral shape along a circumference of the protection member body so as to pass through the inside and the outside of the protection member body, and wherein the electro-conductive part protecting member is elastically deformable in a longitudinal direction of the electro-conductive part.

The spiral groove of the electro-conductive part protecting member may be divided into an upper spiral groove disposed to be adjacent to an upper end portion of the protection member body and a lower spiral groove disposed to be adjacent to a lower end portion of the protection member body.

The spiral groove of the electro-conductive part protecting member may be disposed to be spaced apart from an end of the protection member body.

The electro-conductive part protecting member may be formed of an electro-conductive material to enable the electro-conductive part protecting member to be electrically connected to the terminal when the terminal comes into contact with the electro-conductive part.

Meanwhile, in order to solve the above-described object, a signal transmitting connector according to the present disclosure is a signal transmitting connector connected to an electronic component and being capable of transmitting an electrical signal, and including a plurality of electro-conductive parts, each of which having a configuration in which a plurality of electro-conductive particles are contained in an elastic insulating material in order to enable the electro-conductive part to be connected to a terminal of the electronic component; an insulator formed of an elastic insulating material, and having an insulating part surrounding and supporting the plurality of electro-conductive parts so as to allow the electro-conductive parts to be spaced apart from each other; and a plurality of electro-conductive part protecting members coupled to the insulator to correspond to the plurality of electro-conductive parts, and being spaced apart from and surrounding the corresponding electro-conductive part, wherein the electro-conductive part protecting member is provided with a hollow tubular-shaped protection member body surrounding the electro-conductive part, and a spiral groove formed in a spiral shape along a circumference of the protection member body so as to pass through the inside and the outside of the protection member body, so the electro-conductive part protecting member is elastically deformable in a longitudinal direction of the electro-conductive part.

The electro-conductive part protecting member may be formed of an electro-conductive material so that it can be electrically connected to the terminal of the electronic component, and may be spaced apart from the electro-conductive part within a range within which it can come into contact with the terminal when the terminal is brought into contact with the corresponding electro-conductive part.

The insulator may include an insulating part bump formed integrally with the insulating part so as to protrude from a surface of the insulating part, the electro-conductive part may include an electro-conductive part bump protruding from the surface of the insulating part so as to be surrounded by the insulating part bump, and an upper end portion of the electro-conductive part protecting member may be placed below a surface of the insulating part bump.

The insulator may include an insulating part bump formed integrally with the insulating part so as to protrude from a surface of the insulating part, the electro-conductive part may include an electro-conductive part bump protruding from the surface of the insulating part so as to be surrounded by the insulating part bump, and a height of an upper end portion of the electro-conductive part protecting member may be the same as that of a surface of the insulating part bump.

Meanwhile, in order to solve the above-described object, a method of manufacturing an electro-conductive part protecting member for a signal transmitting connector according to the present disclosure is a method of manufacturing an electro-conductive part protecting member for a signal transmitting connector, which is provided in the signal transmitting connector having a plurality of electro-conductive parts and an insulating part and is capable of protecting the electro-conductive part, the electro-conductive part having a configuration in which a plurality of electro-conductive particles are contained in an elastic insulating material in order to enable the electro-conductive part to be connected to a terminal of an electronic component, and the insulating part being formed of an elastic insulating material and supporting the plurality of electro-conductive parts so as to allow electro-conductive parts to be spaced apart from each other, the method includes the steps of: (a) preparing a hollow tubular-shaped body; (b) coating a surface of the hollow tubular-shaped body with a photoresist; (c) irradiating an outer surface of the hollow tubular-shaped body coated with the photoresist by a light to form a spiral-shaped etching pattern along a circumference of the hollow tubular-shaped body; and (d) etching the hollow tubular-shaped body on which the etching patterns is formed, to form a spiral groove corresponding to the etching pattern penetrate inside and outside the hollow tubular-shaped body.

In the step (a), the hollow tubular-shaped body may be prepared to have a length greater than that of the electro-conductive part protecting member for the signal transmitting connector, in the step (c), the plurality of etching patterns may be formed to be spaced apart from each other along a longitudinal direction of the hollow tubular-shaped body, and after the step (d), the hollow tubular-shaped body may be divided into a plurality of electro-conductive part protecting members for the signal transmitting connectors, each of the electro-conductive part protecting members comprises at least one spiral groove.

On the other hand, in order to solve the above-described object, a method of manufacturing a signal transmitting connector according to the present disclosure is a method of manufacturing a signal transmitting connector connected to an electronic component and being capable of transmitting an electrical signal, the method includes the steps of: (a) preparing a molding mold having a cavity provided therein and a plurality of electro-conductive part protecting members, each of the elector-conductive part protecting members including a hollow tubular-shaped protection member body and a spiral groove formed in a spiral shape along a circumference of the protection member body so as to pass through the inside and the outside of the protection member body; (b) disposing the plurality of electro-conductive part protecting members to be spaced apart from each other in the cavity; (c) injecting a liquid elastic insulating material into the cavity in which the plurality of electro-conductive part protecting members are disposed; (d) curing the elastic insulating material to form an insulating part supporting the plurality of electro-conductive part protecting members, and separating the insulating part to which the plurality of electro-conductive part protecting members are coupled from the molding mold; (e) forming a plurality of insulating part holes in the insulating part so as to pass through portions of the insulating part that are surrounded by the plurality of electro-conductive part protecting members, respectively; (f) injecting an electro-conductive mixture in which electro-conductive particles are contained in a liquid elastic insulating material, into each of the plurality of insulating part holes; and (g) after applying a magnetic field, curing the electro-conductive mixture to form a plurality of electro-conductive parts spaced apart from the electro-conductive part protecting member and surrounded by the electro-conductive part protecting member so as to enable the electro-conductive part to be connected to a terminal of the electronic component.

Advantageous Effects

In the signal transmitting connector according to the present disclosure, since the electro-conductive part protecting member surrounds a circumference of the electro-conductive part which is repeatedly brought into contact with the terminal of the electronic component, a strength of the electro-conductive part is reinforced, and it is possible to minimize a deformation of the electro-conductive part when it comes into contact with the terminal of the electronic component. Therefore, compared to the conventional signal transmitting connector, a deformation is less likely to occur when used for a long time, and the service lifetime is long.

In addition, in the signal transmitting connector according to the present disclosure, when the terminal of the electronic component comes into contact with the electro-conductive part and the electro-conductive part is thus pressurized by the electronic component, the electro-conductive part protecting member may apply an elastic force to the electronic component in the direction opposite to a direction in which the electro-conductive part is pressurized. Therefore, the electro-conductive part is not subjected to an excessive load from the electronic component, so that the electro-conductive part can be protected, and the terminal of the electronic component is guided to be brought into contact with the electro-conductive part with a stable stroke without occurrence of an over-stroke, so it is possible to minimize damage to the electro-conductive part.

In addition, in the signal transmitting connector according to the present disclosure, the electro-conductive part protecting member having elasticity is disposed in the insulator to surround a circumference of the electro-conductive part, so when the electronic component pressurizes the electro-conductive part, the electro-conductive part protecting member may elastically support the electro-conductive part and the insulating part. As a result, a lifetime can be increased.

Furthermore, in the signal transmitting connector according to the present disclosure, the electro-conductive part protecting member protecting the electro-conductive part is formed to have a configuration in which the spiral groove is formed in the hollow tubular-shaped protection member body being capable of surrounding the electro-conductive part and the protection member body may be elastically deformed in its longitudinal direction, so the electro-conductive part protecting member having a relatively thin thickness may stably protect the electro-conductive part. Accordingly, even if a distance between the electro-conductive parts is narrowed, the electro-conductive part can be protected by the thin electro-conductive part protecting member without reducing a width of the electro-conductive part.

MODE FOR CARRYING OUT THE INVENTION

Hereinafter, an electro-conductive part protecting member for a signal transmitting connector according to the present disclosure, a method of manufacturing the same, the signal transmitting connector having the same, and a method of manufacturing the signal transmitting connector are described in detail with reference to the accompanying drawings.

Figure 1:
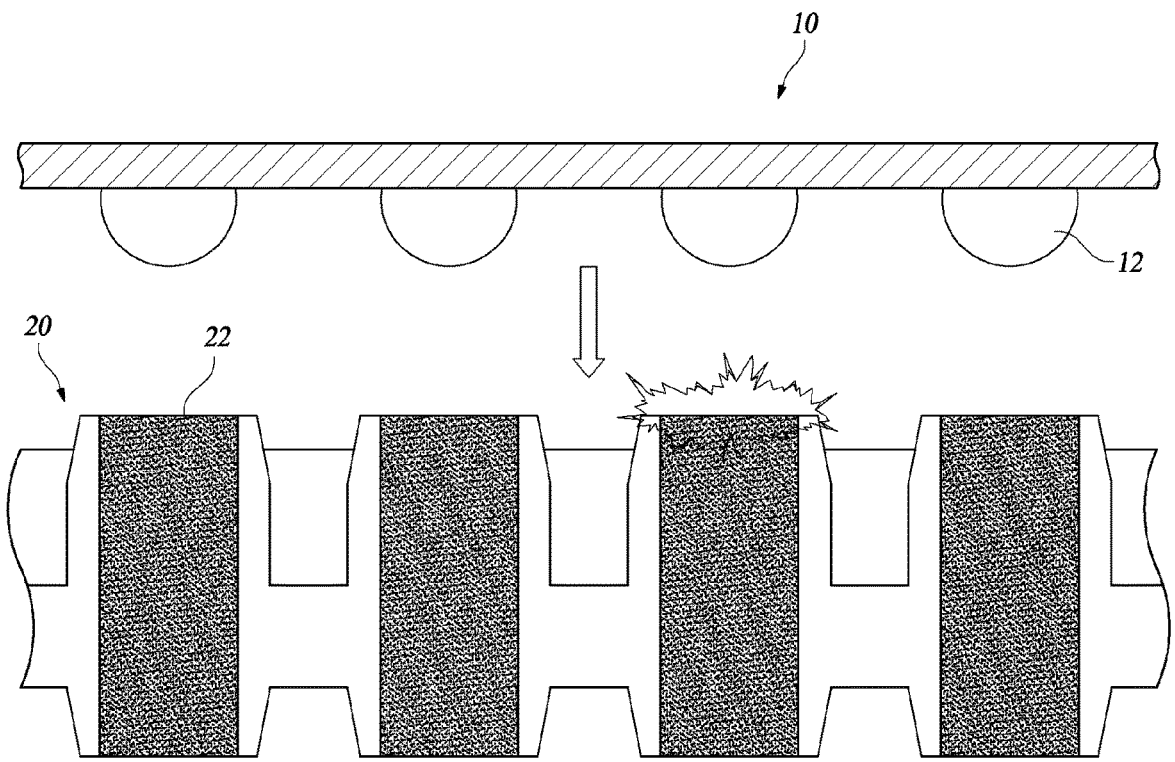
FIG. 1 is a view showing a conventional test socket used for inspecting a semiconductor package.
Figure 2:
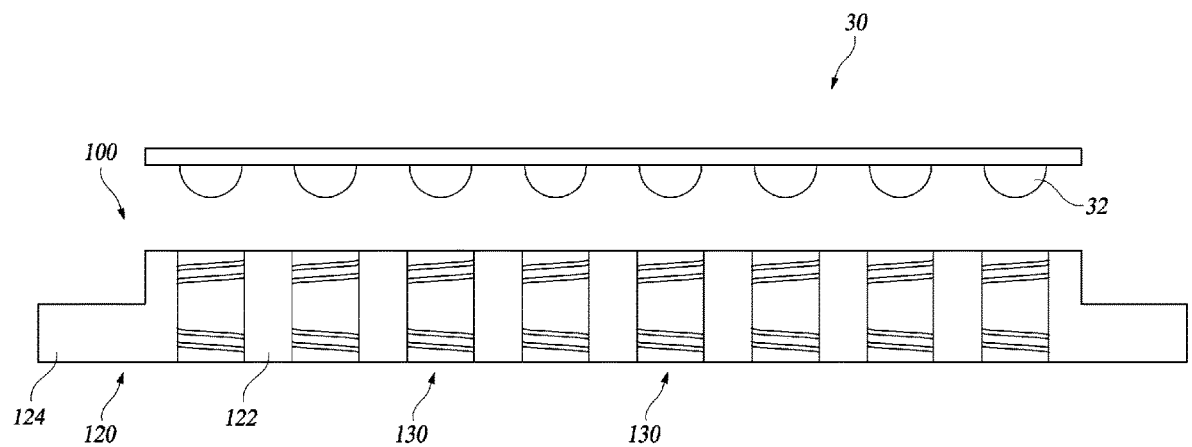
FIG. 2 is a view showing a signal transmitting connector according to one embodiment of the present disclosure and an electronic component connected thereto.
Figure 3:
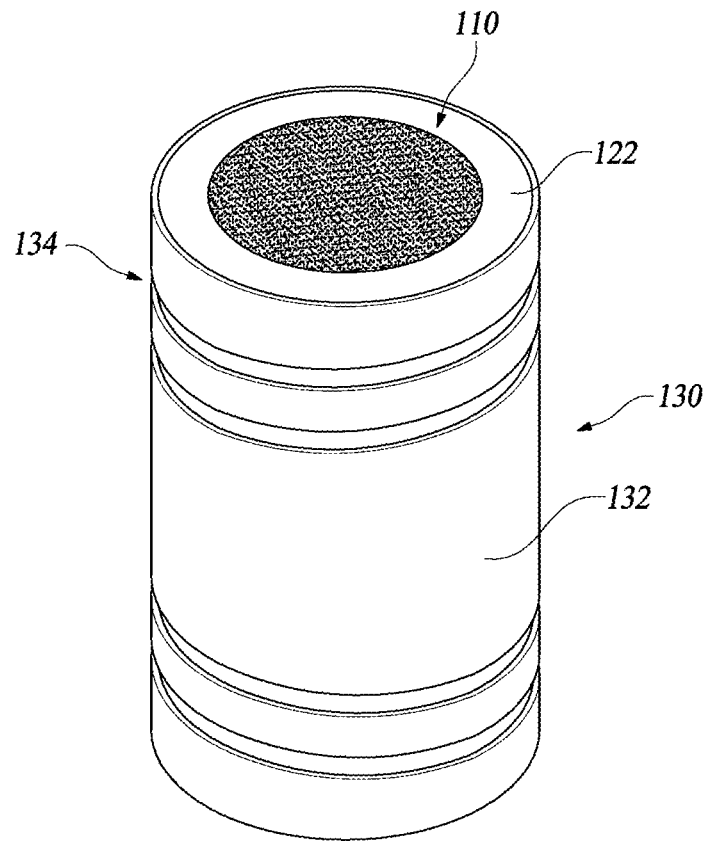
FIGS. 3 and 4 are views showing an electro-conductive part protecting member of the signal transmitting connector according to one embodiment of the present disclosure and a portion surrounded by the electro-conductive part protecting member.
Figure 4:
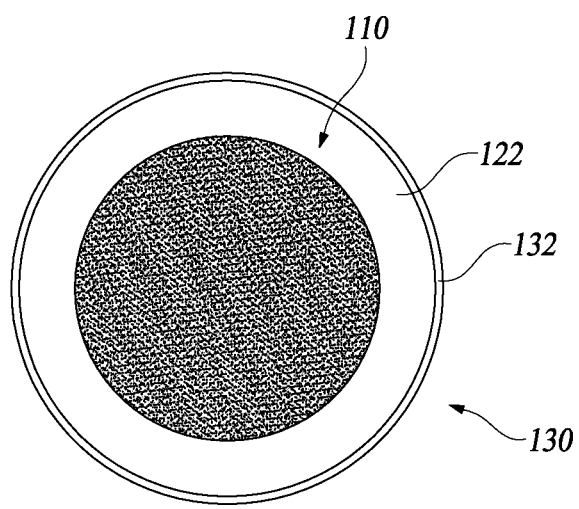
Figure 5:
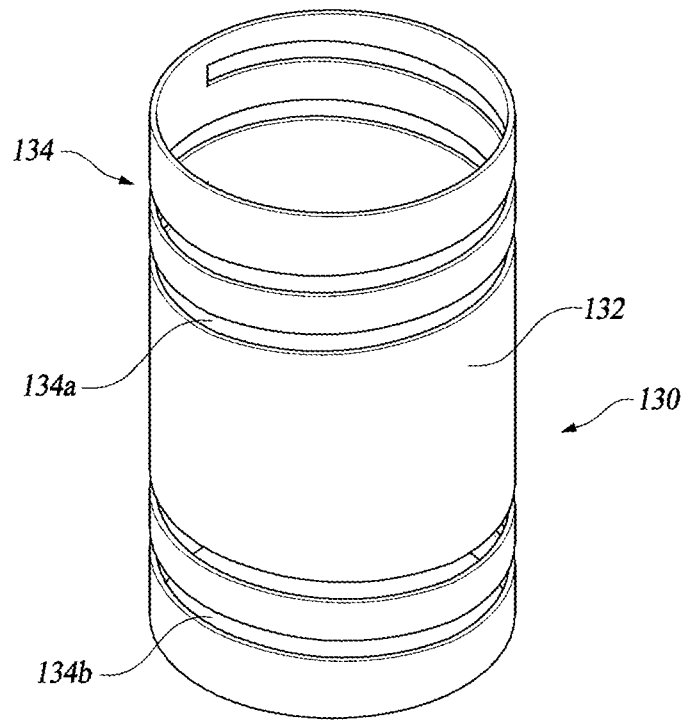
FIG. 5 is a view showing the electro-conductive part protecting member of the signal transmitting connector according to one embodiment of the present disclosure.
Figure 6:
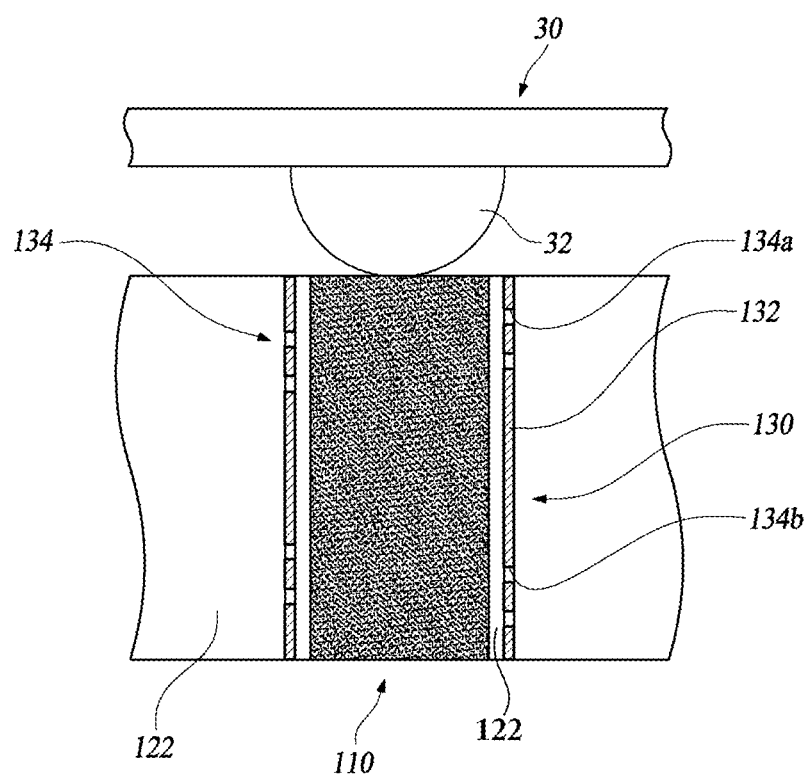
FIG. 6 is a view showing a state in which a terminal of the electronic component is in contact with an electro-conductive part of the signal transmitting connector according to one embodiment of the present disclosure.

FIG. 2 is a view showing a signal transmitting connector according to one embodiment of the present disclosure and an electronic component connected thereto, FIGS. 3 and 4 are views showing an electro-conductive part protecting member of the signal transmitting connector according to one embodiment of the present disclosure and a portion surrounded by the electro-conductive part protecting member, and FIG. 5 is a view showing the electro-conductive part protecting member of the signal transmitting connector according to one embodiment of the present disclosure.

As shown in the drawings, a signal transmitting connector 100 according to one embodiment of the present disclosure may be connected to an electronic component 30 to transmit an electric signal, and includes a plurality of electro-conductive parts 110 which may be connected to terminals 32 of the electronic component 30, an insulator 120 surrounding the plurality of electro-conductive parts 110 and supporting the plurality of electro-conductive parts 110 to allow the electro-conductive parts to be spaced from each other, and a plurality of electro-conductive part protecting members 130 surrounding a circumference of the electro-conductive part 110 and coupled to the insulator 120 to protect the electro-conductive part 110. This signal transmitting connector 100 is connected to various electronic components and transmits the electrical signal, so it may be used for inspecting of the electronic component through a tester, or for electrically connecting the electronic component and various electronic devices.

Hereinafter, an example in which the signal transmitting connector 100 according to one embodiment of the present disclosure is connected to the electronic component 30 and is utilized to inspect the electronic component 30 is described.

The electro-conductive part 110 is formed to have a configuration in which a plurality of electro-conductive particles is contained in an elastic insulating material, in order to enable the electro-conductive part to be connected to the terminal 32 of the electronic component 30. The plurality of electro-conductive parts 110 are disposed and spaced apart from each other inside the insulator 130 so as to correspond to the terminals 32 provided in the electronic component 30 to be connected. The electro-conductive part 110 may be provided in a cylindrical shape or various other shapes passing through the insulator 120 in a thickness direction.

As the elastic insulating material constituting the electro-conductive part 110, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-Diene copolymer rubber, soft liquid epoxy rubber, and the like may be employed.

In addition, as the electro-conductive particle constituting the electro-conductive part 110, the particles having magnetism may be employed so that they can be reacted by a magnetic field. For example, as the electro-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electrical-conductivity, such as gold, silver, palladium, radium, or the like; particles obtained by plating a surface of core particle, for example, non-magnetic metal particles, inorganic substance particles such as glass beads or the like, and polymer particles, with electro-conductive magnetic substance such as nickel, cobalt, or the like; or particles obtained by plating core particle with electro-conductive magnetic substance and a metal having excellent electrical-conductivity may be employed.

The insulator 120 is made of an elastic insulating material and surrounds the plurality of electro-conductive parts 110 to support the plurality of electro-conductive parts 110 so as to allow the electro-conductive parts to be spaced apart from each other. The elastic insulating material constituting the insulator 120 may be an elastic insulating material which is the same as the elastic insulating material constituting the electro-conductive part 110. The insulator 120 includes an insulating part 122 surrounding the plurality of electro-conductive parts 110 and an insulating extension part 124 disposed at an outer side thereof. The insulating extension part 124 may be coupled with a structure such as a support plate for supporting the insulator 120 so as not to be easily deformed.

Referring to FIGS. 2 to 6, the plurality of electro-conductive part protecting members 130 are spaced apart from each electro-conductive part 110 to be insulated from the electro-conductive part 110, and are coupled with the insulating part 122 to surround a circumference of each electro-conductive part 110. The electro-conductive part protecting member 130 may have a cylindrical configuration as shown, or various hollow configurations capable of accommodating the electro-conductive part 110 therein to surround the circumference of the electro-conductive part 110. The electro-conductive part protecting member 130 has a height corresponding to a height of the electro-conductive part 110 placed therein. The electro-conductive part protecting member 130 is disposed to allow its longitudinal direction to be parallel to the longitudinal direction of the electro-conductive part 110, so it may surround the circumference of the electro-conductive part 110 to protect the electro-conductive part 110. Here, the longitudinal direction of the electro-conductive part 110 indicates a direction in which the electro-conductive part 110 is compressed when the terminal 32 of the electronic component 30 comes into contact with the electro-conductive part 110.

The electro-conductive part protecting member 130 includes a hollow tubular-shaped protection member body 132, and a spiral groove 134 provided in the protection member body 132. When the terminal 32 comes into contact with the electro-conductive part 110 and the electro-conductive part 110 is thus subjected to a compressive force in its longitudinal direction, the electro-conductive part protecting member 130 together with the electro-conductive part 110 may be elastically deformed in the longitudinal direction of the electro-conductive part 110.

A width of an inner hole of the protection member body 132 is larger than that of the electro-conductive part 110, so the electro-conductive part 110 may be accommodated in the inner hole of the protection member body 132 so that it is spaced apart from an inner surface of the protection member body 132. An upper end portion of the protection member body 132 has a ring shape parallel to a direction which is substantially orthogonal to the longitudinal direction of the protection member body 132. In addition, a lower end portion of the protection member body 132 has a ring shape substantially parallel to the upper end portion of the protection member body 132.

The spiral groove 134 is formed in a spiral shape along a circumference of the protection member body 132 so as to pass through the inside and the outside of the protection member body 132. The spiral groove 134 is divided into an upper spiral groove 134a disposed to be adjacent to the upper end portion of the protection member body 132 and a lower spiral groove 134b disposed to be adjacent to the lower end portion of the protection member body 132. The upper spiral groove 134a and the lower spiral groove 134b are not connected to each other and are disposed to be spaced apart from each other. The upper spiral groove 134a is spaced apart from the upper end portion of the protection member body 132, and the lower spiral groove 134b is spaced apart from the lower end portion of the protection member body 132.

The above electro-conductive part protecting member 130 surrounds the electro-conductive part 110, so when the electro-conductive part 110 is brought into contact with the terminal 32 of the electronic component 30, the electro-conductive part protecting member supports the electro-conductive part 110 so that it does not spread outward, and reinforces strength of the electro-conductive part 110. Accordingly, when the electronic component 30 is pressed against the signal transmitting connector 100, the electro-conductive part 110 and the insulator 120 may withstand the load caused by a pressurizing force. In addition, the electro-conductive part protecting member 130 may minimize deformation of all of the electro-conductive part 110 and the signal transmitting connector 100, thereby extending the lifetime of the signal transmitting connector 100.

The electro-conductive part protecting member 130 is made of an electro-conductive material, and ends thereof may be exposed outward from a surface of the insulator 120. When the terminal 32 of the electronic component 30 is connected to the electro-conductive part 110, the electro-conductive part protection member 130 having the electrical conductivity may be electrically connected to the terminal 32 of the electronic component 30 together with the electro-conductive part 110 to transmit electrical signals. This electro-conductive part protecting member 130 having the electrical conductivity may serve to expand a connection region of the signal transmitting connector 100. That is, even though the terminal 32 of the electronic component 30 does not come properly into contact with the electro-conductive part 110, the electro-conductive part protecting member 130 is brought into contact with the terminal 32 and transmits an electric signal, so it is possible to reduce the problem of signal transmission caused by incorrect contact of the electro-conductive part 110.

To this end, the electro-conductive part protecting member 130 is disposed to be spaced apart from each electro-conductive part 110 within a range within which the electro-conductive part protecting member may come into contact with the terminal 32 when the terminal 32 is pressed against the corresponding electro-conductive part 110.

As described above, in the signal transmitting connector 100 according to one embodiment of the present disclosure, since the electro-conductive part protecting member 130 surrounds the circumference of the electro-conductive part 110 which is repeatedly brought into contact with the terminal 32 of the electronic component 30, the strength of the electro-conductive part 110 is reinforced and a problem in that the electro-conductive part 110 is deformed or damaged is reduced.

In addition, in the signal transmitting connector 100 according to one embodiment of the present disclosure, the electro-conductive part protecting member 130 for protecting the electro-conductive part 110 has a configuration in which the spiral groove 134 is formed in the hollow tubular-shaped protection member body 132, so it can be elastically deformed in its longitudinal direction, and when the terminal 32 of the electronic component 30 comes into contact with the electro-conductive part 110 and the electro-conductive part 110 is thus pressurized by the electronic component 30, the electro-conductive part protecting member 130 may apply an elastic force to the electronic component 30 in the direction opposite to a direction in which the electro-conductive part 110 is pressurized. Therefore, the electro-conductive part 110 is not subjected to an excessive load from the electronic component 30, so that the electro-conductive part 110 can be protected, and the terminal 32 of the electronic component 30 is guided to be brought into contact with the electro-conductive part 110 with a stable stroke without occurrence of an over-stroke, so it is possible to minimize damage to the electro-conductive part 110.

In addition, in the signal transmitting connector 100 according to one embodiment of the present disclosure, since the electro-conductive part protecting member 130 may be connected to the terminal 32 of the electronic component 30 to transmit an electric signal, and as compared with the prior art in which the electric signal is transmitted only through the electro-conductive part, a connection area between the connector and the electronic component 30 is wider, and the problem of a signal transmission error caused by an erroneous contact between the terminal 32 and the electro-conductive part 110 can be reduced.

In addition, in the signal transmitting connector 100 according to one embodiment of the present disclosure, the electro-conductive part protecting member 130 having elasticity is disposed to surround the circumference of the electro-conductive part 110 like a general coil spring, so when the electronic component 30 pressurizes the electro-conductive part 110, the electro-conductive part protecting member may elastically support the electro-conductive part 110 and the insulating part 122.

In order to maintain an elastic force, a general coil spring should have a wire diameter of more than a suitable thickness. Therefore, when the coil spring is applied to the signal transmitting connector, if a gap between the electro-conductive parts 110 is narrow, a width of the electro-conductive part 110 must be further reduced in order to place the electro-conductive part 110 in the coil spring, and when the width of the electro-conductive part 110 is decreased, resistance value of the electro-conductive part 110 increased and a contact area of the terminal 32 is decreased, thereby increasing the risk of occurrence of a contact failure between the terminal 32 and the electro-conductive part 110. On the contrary, the electro-conductive part protecting member 130 according to the present disclosure may exhibit a required elastic performance while having a thin thickness compared to the conventional coil spring, so the electro-conductive part protecting member can solve a design problem in which the width of the electro-conductive part 110 must be reduced when designing the signal transmitting connector.

In addition, in the case of the conventional coil spring, it is difficult to make the entire end of the coil flat, so when applied to the signal transmitting connector, surface flatness of the insulating part 122 may be deteriorated and a surface of the insulating part 122 may be damaged by repeated contact of the terminal 32. As compared with the conventional coil spring, on the contrary, the entire end of the electro-conductive part protecting member 130 according to the present disclosure is flat, such a problem does not occur.

In addition, since the electro-conductive part protecting member 130 according to the present disclosure is in surface contact with the insulating part 122, a region supporting the elastic insulating material disposed therein is wider than that in the conventional coil spring. Accordingly, it is possible to more stably protect the electro-conductive part 110 and prevent a deformation of the electro-conductive part 110 compared to the conventional coil spring. Since the length of the spiral groove 134 and the like of the electro-conductive part protecting member 130 may be designed in various ways, by making a spiral groove-forming area of the protection member body 132 smaller than a surface area of the protection member body 132 when manufacturing the electro-conductive part protecting member 130, it is possible to secure a region supporting the elastic insulating material disposed inside the electro-conductive part protecting member 130 to a certain size or more.

In addition, the electro-conductive part protecting member 130 according to the present disclosure may be made of various materials, and may be made of various materials such as metal or a material having good bonding strength with an elastic insulating material, a non-metal serving as an insulator, plastic, or the like.

Hereinafter, a method of manufacturing the signal transmitting connector 100 according to one embodiment of the present disclosure as described above with reference to FIGS. 7 to 10 is described.

Figure 7:
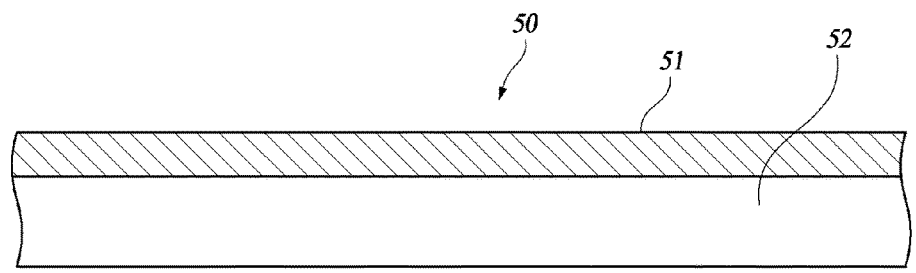
FIGS. 7 to 10 are views for explaining a method of manufacturing the signal transmitting connector according to one embodiment of the present disclosure.

First, a molding mold 50 as shown in FIG. 7 is prepared. The molding mold 50 may include an upper mold 51 and a lower mold 54 which will be disposed to face each other. An upper mold groove 52 is provided inside the upper mold 51, and a lower mold groove 55 is provided inside the lower mold 54.

Figure 8:
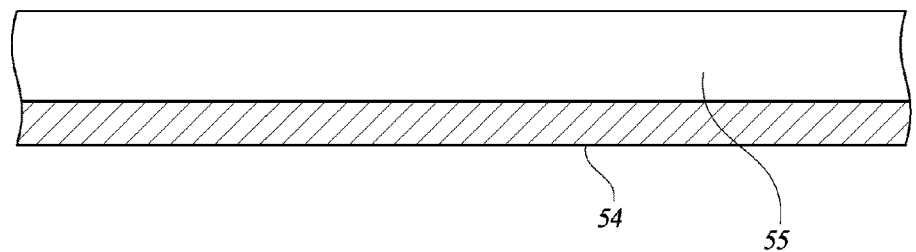

Next, as shown in FIG. 8, the upper mold 51 and the lower mold 54 are stacked to form a cavity 56 surrounded by the upper mold 51 and the lower mold 54, and the plurality of electro-conductive part protecting members 130 are then disposed in the cavity 56 to be spaced apart from each other.

Next, after disposing the electro-conductive part protecting members 130, a liquid elastic insulating material is injected into the cavity 56, and the elastic insulating material injected into the cavity 56 is then cured to form the insulator 120 supporting the plurality of electro-conductive part protecting members 130.

Figure 9:
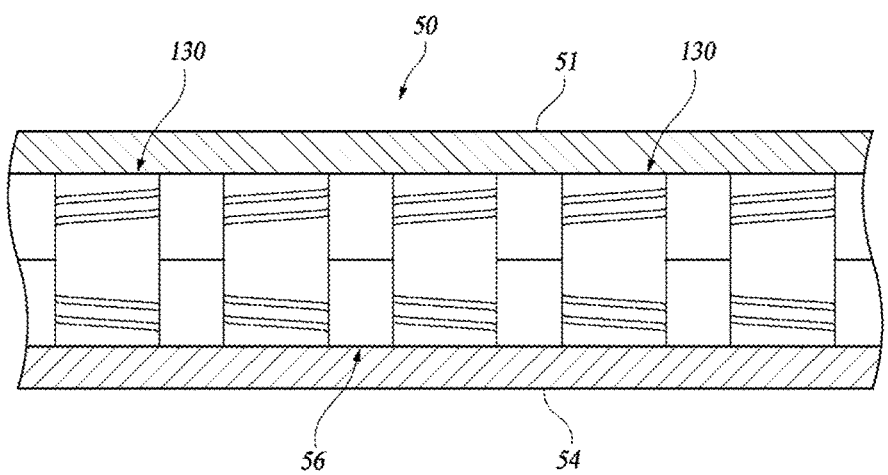

Next, an intermediate molded product 60 to which the insulator 120 and the plurality of electro-conductive part protecting members 130 are connected is separated from the molding mold 50, and as shown in FIG. 9, a plurality of the insulating part holes 62 passing through the intermediate molded product 60 in the thickness direction are formed. At this time, the insulating part hole 62 is formed to have a height corresponding to a height of the electro-conductive part protecting member 130 surrounding a periphery thereof, so as to allow the insulating part hole to pass through a portion in the middle of the insulator 120 surrounded by the electro-conductive part protecting member 130. The insulating part hole 62 may be formed to have a uniform width through various methods such as a laser hole machining, a punching machining, an array machining, or the like.

Figure 10:
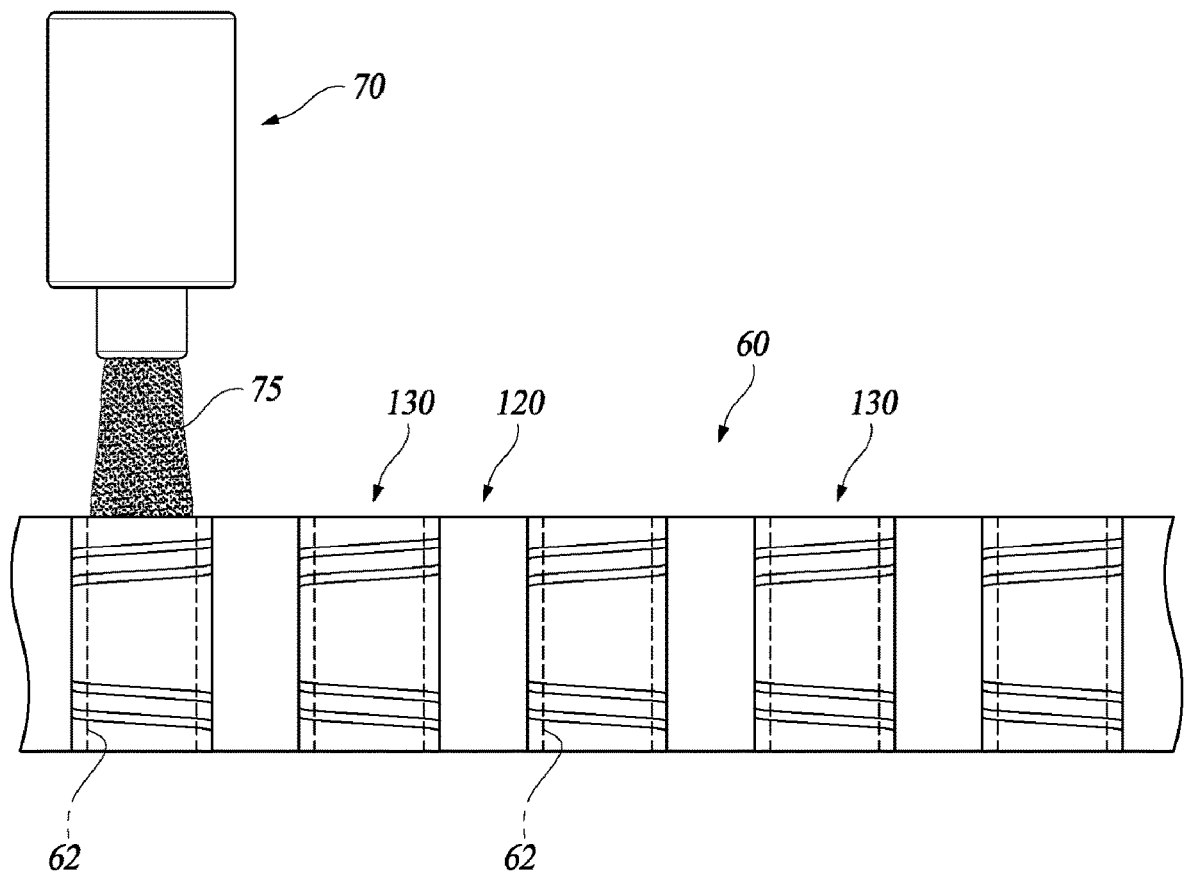

Next, as shown in FIG. 10, an electro-conductive mixture 75 in which electro-conductive particles are contained in a liquid elastic insulating material is injected into each of the plurality of insulating part holes 62 to a height corresponding to the height of each insulating part hole 62. The liquid electro-conductive mixture 75 may be prepared in a state in which the electro-conductive particles are dispersed in the liquid elastic insulating material. At this time, by mixing the liquid electro-conductive mixture 75 with a liquid adhesive primer, a bonding between the electro-conductive particle and the liquid elastic insulating material may be made stronger. In order to fill the insulating part hole 62 with the liquid electro-conductive mixture 75, a dispenser 70 may be employed.

Next, by curing the electro-conductive mixture 75 after applying a magnetic field, in order to enable the electro-conductive part to be connected to the terminal 32 of the electronic component 30, the plurality of electro-conductive parts 110 surrounded by the plurality of electro-conductive part protecting members 130, respectively, may be formed to have a height equal to that of the electro-conductive part protecting members 130 corresponding to those.

A process of injecting the electro-conductive mixture 75 into the insulating part hole 62 and a process of applying the magnetic field to the electro-conductive mixture 75 may be performed in separate molds. When the magnetic field is applied to the electro-conductive mixture 75, due to the influence of the magnetic field, the electro-conductive particles dispersed in the liquid elastic insulating material may be oriented in the thickness direction of the insulator 120 to form an electrical path.

Below, a method of manufacturing the electro-conductive part protecting member 130 of the signal transmitting connector 100 according to one embodiment of the present disclosure as described above with reference to FIGS. 11 to 15 is described.

Figure 11:
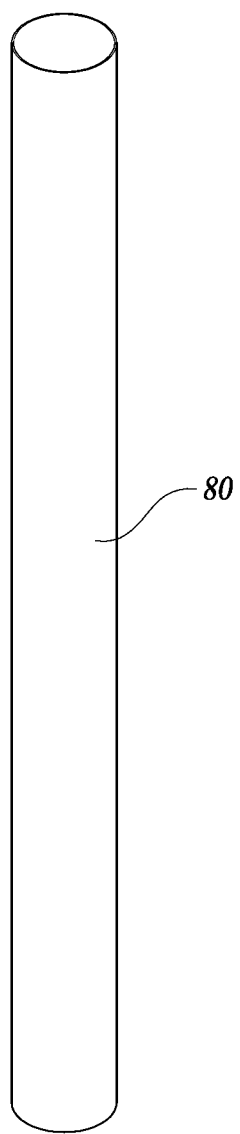
FIGS. 11 to 15 are views for explaining a method of manufacturing the electro-conductive part protecting member of the signal transmitting connector according to one embodiment of the present disclosure.

First, as shown in FIG. 11, a hollow tubular-shaped body 80 is prepared. At this time, the hollow tubular-shaped body 80 may be prepared to have a width and thickness corresponding to those of the designed electro-conductive part protecting member 130, and have a length longer than that of the designed electro-conductive part protecting member 130. In addition, the hollow tubular-shaped body 80 may be made of a variety of materials which can have elasticity, such as metal.

Figure 12:
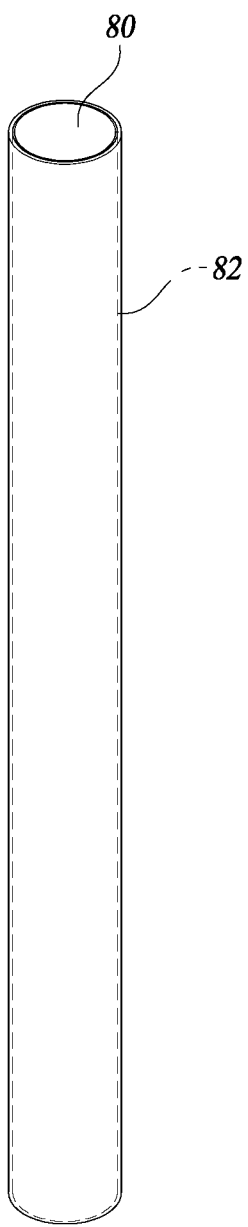

Next, as shown in FIG. 12, a surface of the hollow tubular-shaped body 80 is coated with a photoresist. The surface of the hollow tubular-shaped body 80 may be coated with various known photoresists using various methods.

Figure 13:
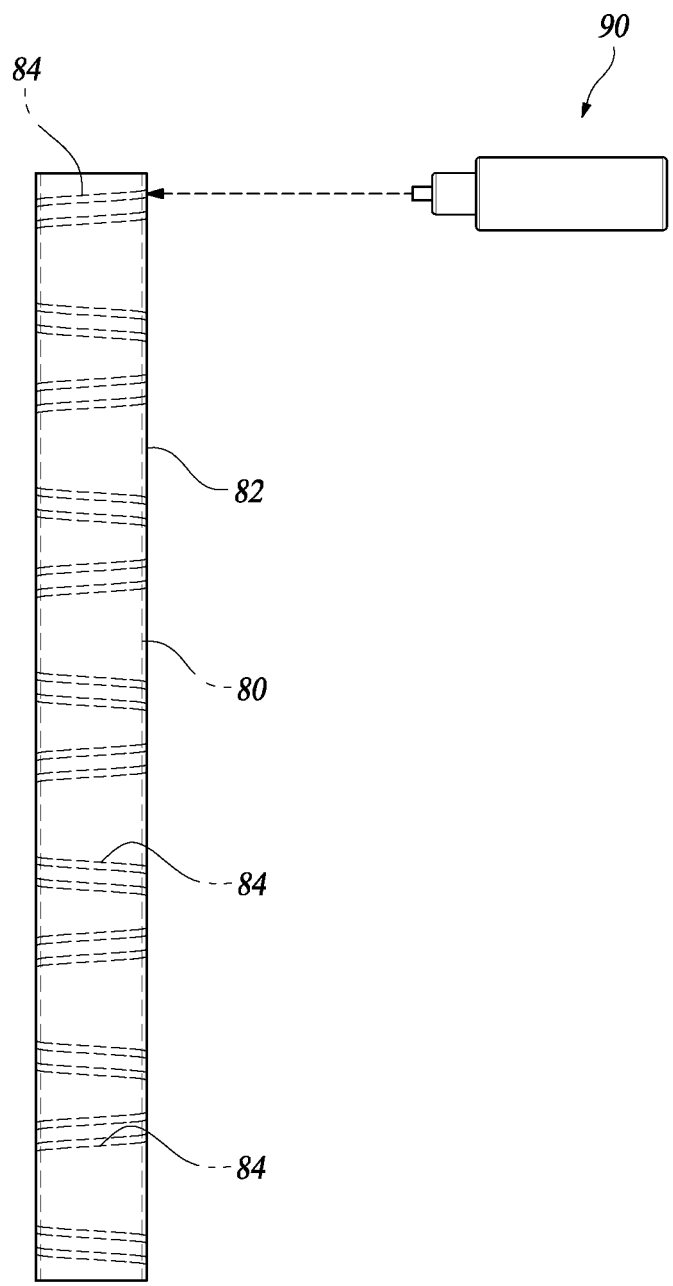

Next, as shown in FIG. 13, an outer surface of the hollow tubular-shaped body 80 coated with a photoresist 82 is irradiated by a light using an exposure apparatus 90 to form a spiral-shaped etching pattern 84 along a circumference of the hollow tubular-shaped body 80. At this time, the plurality of etching patterns 84 may be formed to be spaced apart from each other at predetermined intervals along the longitudinal direction of the hollow tubular-shaped body 80.

As the exposure apparatus 90 utilized in the above exposure process, a variety of known exposure apparatuses such as those using a laser beam may be used. At this time, an exposure region may be changed by the exposure apparatus 90 depending on whether the photoresist 82 is a positive type or a negative type. In this embodiment in which the photoresist 82 is a positive photoresist, a portion exposed by the exposure apparatus 90 in an etching process to be described later is removed to form the spiral groove 134.

Figure 14:
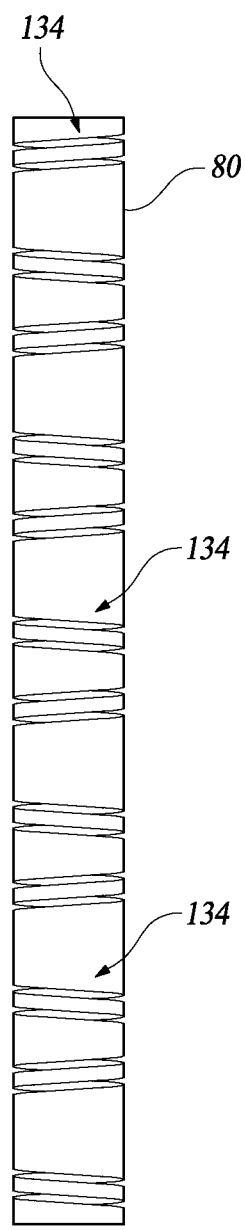

Next, as shown in FIG. 14, by etching the hollow tubular-shaped body 80 on which the plurality of etching patterns 84 are formed, the plurality of spiral grooves 134 corresponding to the plurality of etching patterns 84 are formed to penetrate inside and outside the hollow tubular-shaped body 80. As this etching process, various known etching apparatuses or etching methods may be utilized.

Figure 15:
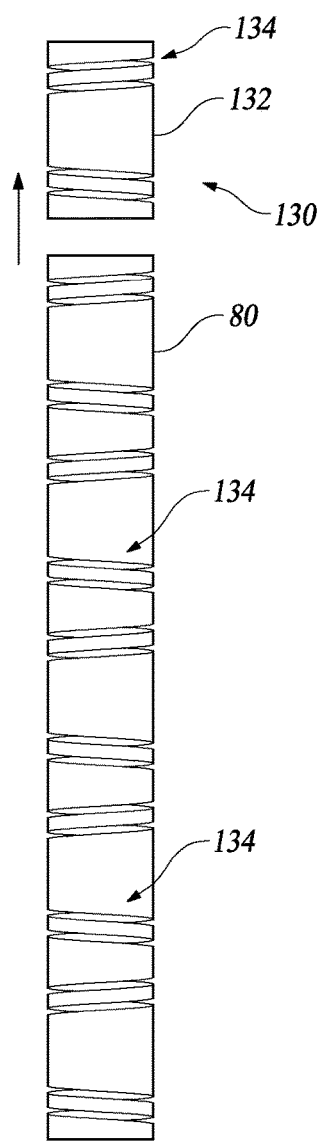

Next, as shown in FIG. 15, the hollow tubular-shaped body 80 in which a plurality of spiral grooves 134 is formed is cut. In this cutting process, by dividing the hollow tubular-shaped body 80 into the plurality of electro-conductive part protecting members 130 including at least one spiral groove 134, the plurality of electro-conductive part protecting members 130 may be obtained from the one hollow tubular-shaped body 80.

In the above-described method of manufacturing the electro-conductive part protecting member for the signal transmitting connector according to one embodiment of the present disclosure, it is possible to quickly and efficiently manufacture the plurality of electro-conductive part protecting members 130 using the hollow tubular-shaped body 80 having a length longer than the electro-conductive part protecting member 130. This manufacturing method has fewer manufacturing man-hours than the conventional coil spring, and may to reduce the manufacturing cost of the electro-conductive part protecting member.

In addition, the method of manufacturing the electro-conductive part protecting member for the signal transmitting connector according to one embodiment of the present disclosure may manufacture the electro-conductive part protecting member having a more precise dimension, and may precisely form a length or thickness of the electro-conductive part protecting member according to the design structure.

In the method of manufacturing the electro-conductive part protecting member for the signal transmitting connector according to the present disclosure, the hollow tubular-shaped body having the same length as that of the designed electro-conductive part protecting member is prepared, and one electro-conductive part protecting member may be then manufactured from one hollow tubular-shaped body.

Figure 16:
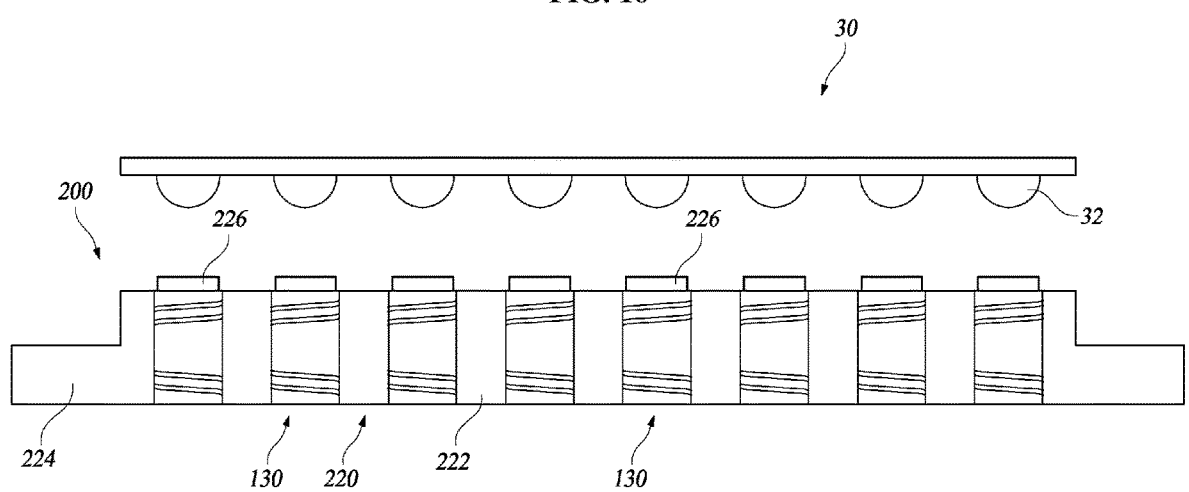
FIG. 16 is a view showing a signal transmitting connector according to another embodiment of the present disclosure and an electronic component connected thereto.
Figure 17:
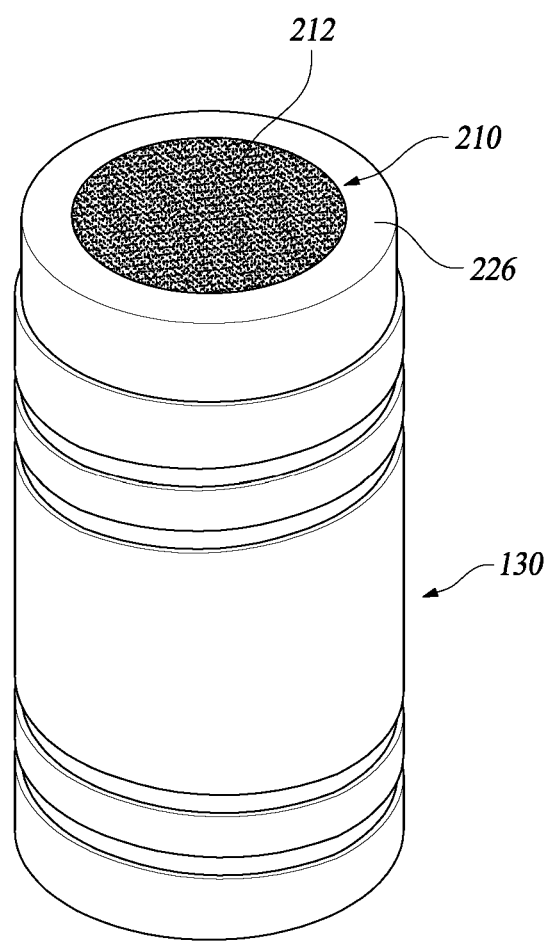
FIG. 17 is a view showing an electro-conductive part protecting member of the signal transmitting connector shown in FIG. 16 and a portion surrounded by the electro-conductive part protecting member.
Figure 18:
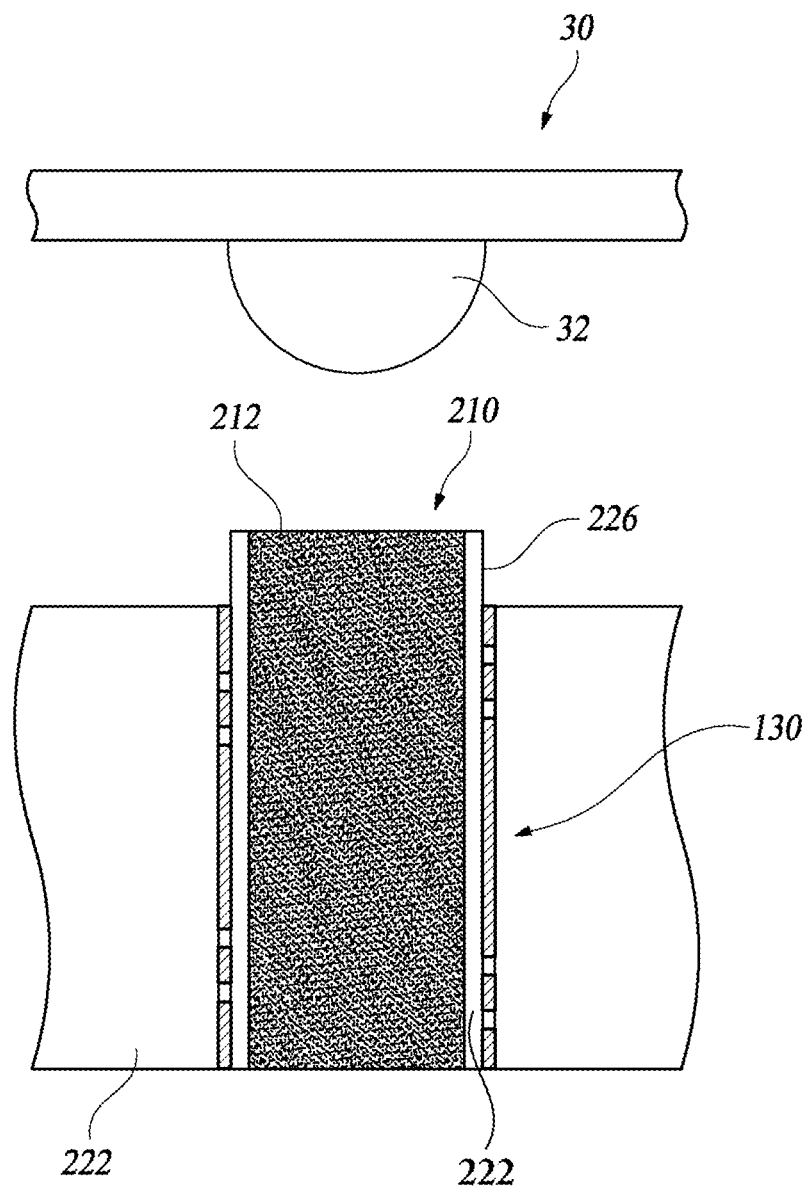
FIG. 18 is a view showing a portion of the signal transmitting connector and a portion of the electronic component shown in FIG. 16.

Meanwhile, FIG. 16 is a view showing a signal transmitting connector according to another embodiment of the present disclosure and an electronic component connected thereto, FIG. 17 is a view showing an electro-conductive part protecting member of the signal transmitting connector shown in FIG. 16 and a portion surrounded by the electro-conductive part protecting member, and FIG. 18 is a view showing a portion of the signal transmitting connector and a portion of the electronic component shown in FIG. 16.

A signal transmitting connector 200 shown in FIGS. 16 to 18 includes a plurality of electro-conductive parts 210 which may be connected to the terminals 32 of the electronic component 30, an insulator 220 surrounding the plurality of electro-conductive parts 210 and supporting the plurality of electro-conductive parts 210 so as to allow the electro-conductive parts be spaced from each other, and a plurality of electro-conductive part protecting members 130 surrounding a circumference of the electro-conductive part 110 and coupled to the insulator 220 to protect the electro-conductive part 210. In this signal transmitting connector 200, as compared with the signal transmitting connector 100 previously described above, the electro-conductive part 210 and the insulator 220 are slightly modified, but the electro-conductive part protecting member 130 is the same as that described above.

The electro-conductive part 210 is formed to have a configuration in which a plurality of electro-conductive particles is contained in an elastic insulating material, in order to enable the electro-conductive part to be connected to the terminal 32 of the electronic component 30, and this electro-conductive part has an electro-conductive part bump 212 protruding from a surface of the insulator 212.

The insulator 220 is made of an elastic insulating material, and includes an insulating part 222 surrounding the plurality of electro-conductive parts 210, an insulating extension part 224 disposed at an outside, and an insulating part bump 226 formed integrally with the insulating part 222 so as to protrude from a surface of the insulating part 222. A protruding height of the insulating part bump 226 is substantially the same as a protruding height of the electro-conductive part bump 212, and the insulating part bump 226 surrounds a circumference of the electro-conductive part bump 212.

The signal transmitting connector 200 configured as above is provided with the electro-conductive part bump 212 protruding from the surface of the insulating part 222 so that the electro-conductive part 210 can be in contact with the terminal 32 of the electronic component 30, so it is possible for the electro-conductive part to more smoothly be connected to the terminal 32 of the electronic component 30. In addition, since electro-conductive part protecting member 130 surrounds the circumference of the electro-conductive part 210, the strength of the electro-conductive part 210 is reinforced and it is possible to reduce the problem in that the electro-conductive part bump 212 is deformed or damaged when the terminal 32 of the electronic component 30 is pressed against the electro-conductive part bump 212.

Figure 19:
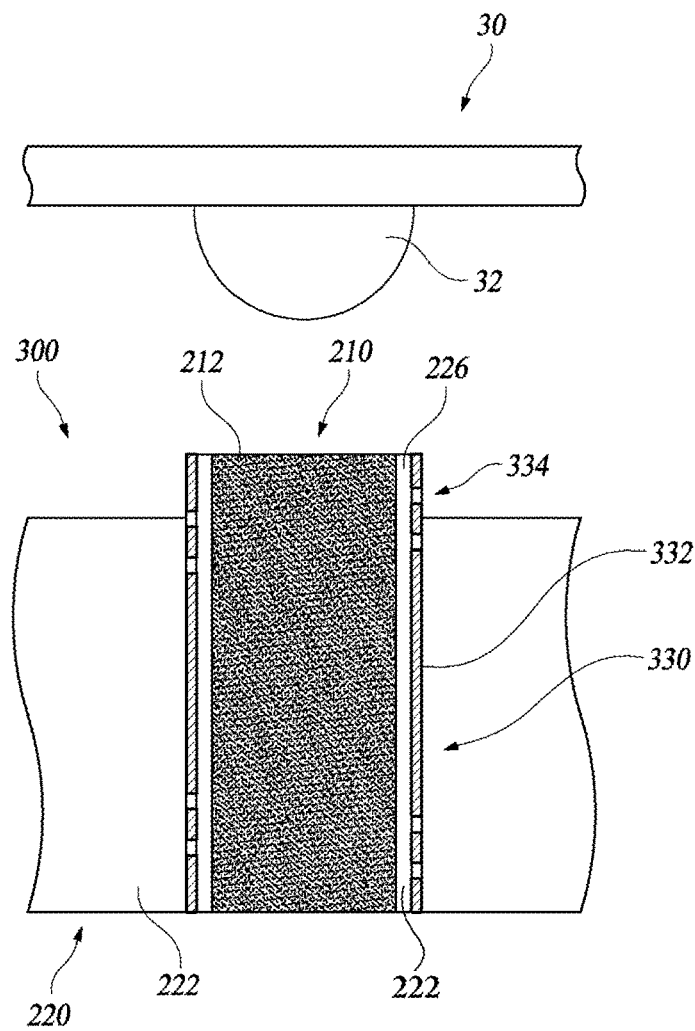
FIG. 19 is a view partially showing a signal transmitting connector according to still another embodiment of the present disclosure and an electronic component connected thereto.

Meanwhile, FIG. 19 is a view partially showing a signal transmitting connector according to still another embodiment of the present disclosure and an electronic component connected thereto.

A signal transmitting connector 300 shown in FIG. 19 includes the plurality of electro-conductive parts 210, the insulator 220 surrounding the plurality of electro-conductive parts 210 and supporting the plurality of electro-conductive parts 210 to allow the electro-conductive parts to be spaced from each other, and a plurality of electro-conductive part protecting members 330 surrounding a circumference of the electro-conductive part 110 and coupled to the insulator 220 to protect the electro-conductive part 210. In this signal transmitting connector 300, as compared with the signal transmitting connector 200 previously described above, configurations of the electro-conductive part 210 and the insulator 220 are not changed, and the electro-conductive part protecting member 330 is slightly modified.

The electro-conductive part protecting member 330 is spaced apart from each electro-conductive part 210 to be insulated from each electro-conductive part 210, and is coupled to the insulating part 222 so as to surround a circumference of each electro-conductive part 210. The electro-conductive part protecting member 330 includes a hollow tubular-shaped protection member body 332 and a spiral groove 334 provided in the protection member body 332, and may be elastically deformed in a longitudinal direction of the electro-conductive part 210. The electro-conductive part protecting member 330 has a height corresponding to a height of the electro-conductive part 210 disposed therein. That is, a height of an upper end portion of the electro-conductive part protecting member 330 is the same as that of surfaces of the insulating part bump 226 and the electro-conductive part bump 212. Since the electro-conductive part protecting member 330 configured as above surrounds the entire electro-conductive part 210 including the electro-conductive part bump 212 protruding from the insulating part 222, when the terminal 32 of the electronic element 30 is pressed against the electro-conductive part bump 212, it is possible to more stably protect the entire electro-conductive part 210 including the electro-conductive part bump 212 from being deformed or damaged Although a preferred example has been described above for the present disclosure, the scope of the present disclosure is not limited to the form described and illustrated above.

For example, even though, in the previous description, it has been described that the electro-conductive part protecting member is made of then electro-conductive material capable of transmitting then electric signal and its end is exposed to the outside of the insulator so as to be electrically connected to the terminal of the electronic component, the electro-conductive part protecting member may be made of a non-electro-conductive material. The electro-conductive part protecting member made of the non-conductive material cannot transmit the electric signal and may perform a function of increasing the strength of the electro-conductive part. In this case, an end of the electro-conductive part protecting member does not need to be exposed to the outside of the insulator and may be entirely embedded in the insulator.

In addition, although the drawings depict that the protection member body of the electro-conductive part protecting member has a cylindrical configuration, the protection member body may be formed to have various hollow tubular-shaped structures having various cross-sections such as ovals, polygons, etc. other than a circular cross-section.

In addition, even though, the drawing show that the spiral groove provided in the electro-conductive part protecting member is divided into the upper spiral groove disposed to be adjacent to the upper end portion of the protection member body and the lower spiral groove spaced apart from the upper spiral groove and disposed to be adjacent to the lower end of the protection member body, the number of the spiral grooves or a position on which the spiral groove is formed may be variously changed.

Figure 20:
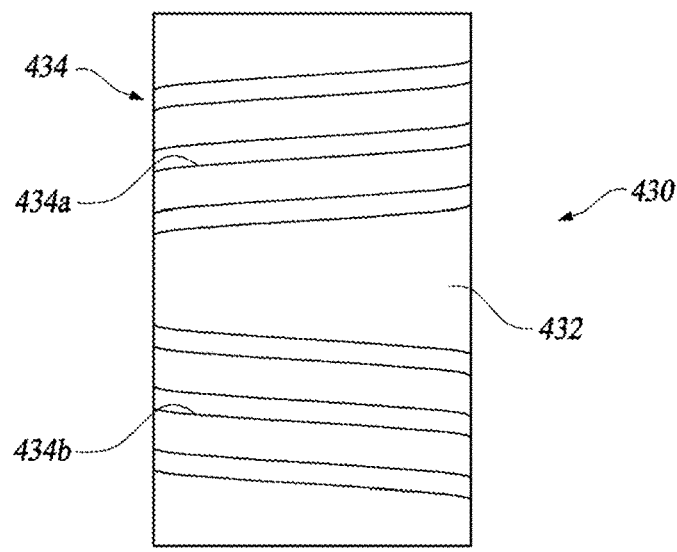
FIG. 20 is a view showing a modified example of the electro-conductive part protecting member.

For example, an electro-conductive part protecting member 430 shown in FIG. 20 includes a hollow tubular-shaped protection member body 432, and a spiral groove 434 provided in the protection member body 432, and the spiral groove 434 is divided into an upper spiral groove 434a and a lower spiral groove 434b disposed to be adjacent to upper and lower end portions of the protective member body 432, respectively, in order to be spaced apart from each other. The upper spiral groove 434a and the lower spiral groove 434b are not connected to each other, but disposed to be spaced from each other.

This electro-conductive part protecting member 430 has the configuration in which the length of the spiral groove 434, that is, the number of turns of the spiral groove 434 on an outer circumferential surface of the protection member body 432 is increased, so it may have a relatively small modulus of elasticity. In this way, by variously designing the number of turns of the spiral groove, the width of the spiral groove, a pitch distance of the spiral grooves on the surface of the protection member body, and a spiral groove-forming area of the surface of the protection member body, it is possible to implement the electro-conductive part protecting members having various elasticities or modulus of elasticity. As another example, ends of the upper spiral groove and the lower spiral groove may be connected to each other without being spaced apart from each other, and elasticity, modulus of elasticity, or load-bearing strength of the electro-conductive part protecting member may be variously adjusted by changing the structure of the above spiral groove.

Further, even though, in the foregoing description, it has been described that the signal transmitting connector is manufactured by the method including placing the electro-conductive part protecting member inside the molding mold, injecting the liquid elastic insulating material into the molding mold to form the intermediate molded product, machining the intermediate molded product to form the insulating part hole, and then injecting the liquid electro-conductive mixture into the insulating part hole, the signal transmitting connector may be manufactured by various other methods other than the above manufacturing method.

In addition, even though, in the foregoing description, it has been described that the hollow tubular-shaped body is coated with the photoresist, and the exposure process and the etching process are sequentially performed to manufacture the electro-conductive part protecting member, the electro-conductive part protecting member may be manufactured by various other methods other than the above manufacturing method.

In the above, the present disclosure has been illustrated and described in connection with a preferred embodiment for illustrating the principle of the present disclosure, but the present disclosure is not limited to the configuration and operation as shown and described as such. Rather, it will be well understood by those skilled in the art that many changes and modifications can be made to the present disclosure without departing from the spirit and scope of the appended claims.

The invention claimed is:

1. An electro-conductive part protecting member for a signal transmitting connector, which is provided in the signal transmitting connector having a plurality of electro-conductive parts and an insulating part and is capable of protecting the electro-conductive part, the electro-conductive part having a configuration in which a plurality of electro-conductive particles are contained in an elastic insulating material in order to enable the electro-conductive part to be connected to a terminal of an electronic component, and the insulating part being formed of an elastic insulating material and supporting the plurality of electro-conductive parts so as to be spaced apart from each other, wherein the electro-conductive part protecting member comprises:
    a hollow tubular-shaped protection member body disposed in the insulating part so as to be spaced apart from and surround the electro-conductive part, and
    a spiral groove formed in a spiral shape along a circumference of the protection member body by partially etching the protection member body so as to pass through the inside and the outside of the protection member body, wherein the electro-conductive part protecting member is elastically deformable in a longitudinal direction of the electro-conductive part, wherein the protection member body is formed of an electro-conductive material so as to enable the protection member body to be electrically connected to the terminal, wherein the spiral groove is divided into an upper spiral groove disposed to be adjacent to an upper end portion of the protection member body and a lower spiral groove disposed to be adjacent to a lower end portion of the protection member body.

2. A signal transmitting connector connected to an electronic component and being capable of transmitting an electrical signal, comprising:

a plurality of electro-conductive parts, each of which having a configuration in which a plurality of electro-conductive particles is contained in an elastic insulating material in order to enable the electro-conductive part to be connected to a terminal of the electronic component;

an insulator formed of an elastic insulating material, and having an insulating part surrounding and supporting the plurality of electro-conductive parts so as to be spaced apart from each other; and a plurality of electro-conductive part protecting members coupled to the insulator to correspond to the plurality of electro-conductive parts, and being spaced apart from and surrounding the corresponding electro-conductive part, wherein an elastic insulating material of the insulating part is disposed between the electro-conductive part and the electro-conductive part protecting member, wherein the electro-conductive part protecting member is provided with a hollow tubular-shaped protection member body surrounding the electro-conductive part, and a spiral groove formed in a spiral shape along a circumference of the protection member body by etching the protection member body so as to pass through the inside and the outside of the protection member body, so the electro-conductive part protecting member is elastically deformable in a longitudinal direction of the electro-conductive part, wherein the protection member body is formed of an electro-conductive material so as to enable the protection member body to be electrically connected to the terminal when the terminal comes into contact with the electro-conductive part, and wherein the spiral groove is divided into an upper spiral groove disposed to be adjacent to an upper end portion of the protection member body and a lower spiral groove disposed to be adjacent to a lower end portion of the protection member body.

3. The signal transmitting connector of claim 2, wherein the insulator comprises an insulating part bump formed integrally with the insulating part so as to protrude from a surface of the insulating part, the electro-conductive part comprises an electro-conductive part bump protruding from the surface of the insulating part so as to be surrounded by the insulating part bump, and an upper end portion of the electro-conductive part protecting member is placed below a surface of the insulating part bump.

4. The signal transmitting connector of claim 2, wherein the insulator comprises an insulating part bump formed integrally with the insulating part so as to protrude from a surface of the insulating part, the electro-conductive part comprises an electro-conductive part bump protruding from the surface of the insulating part so as to be surrounded by the insulating part bump, and a height of an upper end portion of the electro-conductive part protecting member is the same as that of a surface of the insulating part bump to allow the electro-conductive part protecting member to surround the insulating part bump.

5. A method of manufacturing an electro-conductive part protecting member for a signal transmitting connector, which is provided in the signal transmitting connector having a plurality of electro-conductive parts and an insulating part and is capable of protecting the electro-conductive part, the electro-conductive part having a configuration in which a plurality of electro-conductive particles are contained in an elastic insulating material in order to enable the electro-conductive part to be connected to a terminal of an electronic component, and the insulating part being formed of an elastic insulating material and supporting the plurality of electro-conductive parts so as to allow the electro-conductive parts to be spaced apart from each other, the method comprising the steps of:
(a) preparing a hollow tubular-shaped body;
(b) coating a surface of the hollow tubular-shaped body with a photoresist;
(c) irradiating an outer surface of the hollow tubular-shaped body coated with the photoresist by a light to form a spiral-shaped etching pattern along a circumference of the hollow tubular-shaped body; and
(d) etching the hollow tubular-shaped body on which the etching patterns is formed, to form a spiral groove corresponding to the etching pattern penetrate inside and outside the hollow tubular-shaped body.

6. The method of manufacturing the electro-conductive part protecting member for the signal transmitting connector of claim 5, wherein:
in the step (a), the hollow tubular-shaped body is prepared to have a length greater than that of the electro-conductive part protecting member for the signal transmitting connector;
in the step (c), the plurality of etching patterns is formed to be spaced apart from each other along a longitudinal direction of the hollow tubular-shaped body; and
after the step (d), the hollow tubular-shaped body is divided into a plurality of electro-conductive part protecting members for the signal transmitting connectors, each of the electro-conductive part protecting members comprises at least one spiral groove.

7. A method of manufacturing a signal transmitting connector connected to an electronic component and being capable of transmitting an electrical signal, comprising the steps of:
(a) preparing a molding mold having a cavity provided therein and a plurality of electro-conductive part protecting members, each of the elector-conductive part protecting members including a hollow tubular-shaped protection member body and a spiral groove formed in a spiral shape along a circumference of the protection member body so as to pass through the inside and the outside of the protection member body;
(b) disposing the plurality of electro-conductive part protecting members to be spaced apart from each other in the cavity;
(c) injecting a liquid elastic insulating material into the cavity in which the plurality of electro-conductive part protecting members are disposed;
(d) curing the elastic insulating material to form an insulating part supporting the plurality of electro-conductive part protecting members, and separating the insulating part to which the plurality of electro-conductive part protecting members are coupled from the molding mold;
(e) forming a plurality of insulating part holes in the insulating part so as to pass through portions of the insulating part that are surrounded by the plurality of electro-conductive part protecting members, respectively;
(f) injecting an electro-conductive mixture in which electro-conductive particles are contained in a liquid elastic insulating material, into each of the plurality of insulating part holes; and
(g) after applying a magnetic field, curing the electro-conductive mixture to form a plurality of electro-conductive parts spaced apart from the electro-conductive part protecting member and surrounded by the electro-conductive part protecting member so as to enable the electro-conductive part to be connected to a terminal of the electronic component.

* * * * *